United States Patent [19]

Fyfe et al.

[11] 4,201,941

[45] May 6, 1980

[54] SPINNING APPARATUS FOR NMR SPECTROMETERS

[75] Inventors: Colin A. Fyfe, Guelph, Canada; Horst G. Mossbrugger, San Jose; Costantino S. Yannoni, Los Gatos, both of Calif.

[73] Assignee: International Business Machines Corporation, Armonk, N.Y.

[21] Appl. No.: 930,846

[22] Filed: Aug. 4, 1978

[51] Int. Cl.$^2$ ............................................. G01R 33/08
[52] U.S. Cl. .................................................... 324/321
[58] Field of Search ............. 324/0.5 R, 0.5 A, 0.5 AH

[56] References Cited

PUBLICATIONS

Progress in Nuclear Magnetic Resonance Spectroscopy, vol. 8, by Emsley, Feeney, and Sutcliffe, Pergamon Press, 1972, pp. 24–27.

*Primary Examiner*—Michael J. Tokar
*Attorney, Agent, or Firm*—George E. Roush

[57] ABSTRACT

This spinning apparatus for nuclear magnetic resonance (NMR) spectrometers is readily mountable and demountable in the spectrometer and is arranged for ease in loading samples to be spun. The apparatus is also arranged for ease in aligning the sample in the magnetic field for obtaining optimum results. At the same time, the apparatus is simple, and inexpensive in construction. Basically, the spinning apparatus comprises a stator assembly in the form of a nonmagnetic cylindrical body member having a conical bore arranged at an angle to the longitudinal axis of the body member lying between 45° and 90° and located in approximately one-half of the body member. A rotor assembly comprising a conical head portion and a cylindrical tail portion fits into the conical bore for spinning the sample which is loaded into the cylindrical portion. An elongated bore in the body member is arranged for supplying gas to a manifold arranged in the body member for application through jets into the conical bore and against the conical portion of the rotor assembly. The rotor assembly rides on a gas bearing for efficient, wear free and less critical operation and preferably has fluting for better drive. The conical head portion preferably is cut with a compound angle for easier starting and for importing greater stability in spinning.

18 Claims, 5 Drawing Figures

U.S. Patent   May, 6, 1980   4,201,941

4,201,941

SPINNING APPARATUS FOR NMR SPECTROMETERS

FIELD OF INVENTION

The invention relates to nuclear magnetic resonance (NMR) spectroscopy, and it particularly pertains to gas driven apparatus having a gas-bearing, for spinning a sample of material in a magnetic field.

BACKGROUND

Nuclear magnetic resonance spectroscopy has been known for a number of decades. In general, an NMR spectrometer comprises an apparatus wherein a spinnable member is rotated at substantially steady speeds about an axis of rotation intersecting the axis of a magnetic field set up in working gaps extending between two opposed poles of a magnet which, as a result of the gap, gives rise to a considerable magnetic field barreling out from pole to pole. In most NMR spectrometers, the sample is mounted in a form of rotor assembly which is pivotally mounted by rather complex structure within a probe slidable along guideways into and out of the working gap of a permanent magnet providing the polarizing field necessary for the NMR analysis. The various probe arrangements suggested to date leave much to be desired for a number of reasons as will be seen from a review of pertinent prior art.

PRIOR ART

Representative prior art is found in the following U.S. Patents:

| | | | |
|---|---|---|---|
| 2,906,649 | 11/1960 | BLOCH | 324/0.5 |
| 3,172,035 | 3/1965 | ARNOLD ET AL | 324/0.5 |
| 3,462,677 | 8/1969 | PAITICH | 324/0.5 |
| 3,568,047 | 3/1971 | LOOK ET AL | 324/0.5 |
| 3,588,677 | 6/1971 | KLELMAN ET AL | 324/0.5 |
| 3,681,683 | 8/1972 | HUBER | 324/0.5R |
| 3,746,971 | 7/1973 | STOREY ET AL | 324/0.5R |
| 3,796,946 | 3/1974 | UTSUMI ET AL | 324/0.5R |
| 3,911,355 | 10/1975 | LEANE ET AL | 324/0.5AH | and in the published technical literature;

A. C. Cunningham and S. M. Day; "Pulsed NMR of $Na^{23}$ in Rapidly Rotated NaCl"; Physical Review; Vol 152, Nr 1; 1966; p 289.

H. Kessemeyer and R. E. Norberg; "Pulsed NMR in Rotating Solids"; Physical Review; Vol 155, Nr 2; 1967; p 321.

E. R. Andrew; "The Narrowing of NMR Spectra of Solids by High Speed Specimen Rotation and The Resolution of Chemical Shift and Spin Multiplet Structures for Solids"; Progress in NMR Spectroscopy, Volume 8, Nr 1; 1971; pp 25-6.

B. Schnieder, D. Doskocilova and H. Pincova; "Magnetic Resonance in Chemistry and Biology"; Proceedings International Summer School, Yugoslavia; 1971; FIGS. 7 & 8.

E. O. Stejskal, et al; "Carbon-13 NMR of Adsorbed $CO_2$"; Journal of Chemical Physics, Vol 61, Nr. 6; 1974; p 2351.

This prior art is all directed to NMR spectroscopy and many of the component parts shown and suggested have much in common with the structure according to the invention and because the spectroscopy is unchanged, some of the component interrelationships are quite similar.

However, the spinning apparatus disclosed in these prior art references is of complex construction that frequently leaves the apparatus of the prior art difficult to insert and to withdraw from the conventional spectrometers and even more difficult to align the axis of the spinning at a precise angle to one or more of the normal axes of the structure of the spectrometer. In other prior art arrangements, the spinning is unreliable.

SUMMARY OF THE INVENTION

The objects of the invention indirectly referred to hereinbefore, and those that will appear as the specification progresses, are attained in a simple, easily fabricated and efficiently operating device of substantially unitary construction. Basically the spinning apparatus comprises a stator assembly in the form of an elongated nonmagnetic body member readily insertable into and removable from conventional spectrometers. Within the body member, a conical bore is arranged at an angle lying between and including 45° and 90° to the longitudinal axis of the body member and a rotor assembly having a cylindrical portion in which the sample is easily placed and a conical head portion, having a configuration complementary to conical bore, and a relatively few other bores arranged in the body member for directing a gas into the conical bore for providing a gas bearing on which the rotor assembly rides, and at the same time directing the gas onto the conical portion of the rotor assembly for spinning it at a desired relatively high speed.

DRAWING

In order that full advantage of the invention obtain in practice, the best mode embodiment thereof, given by way of example only, is described in detail hereinafter with reference to the accompanying drawing, forming a part of this specification, and in which.

DESCRIPTION

Figure 1:
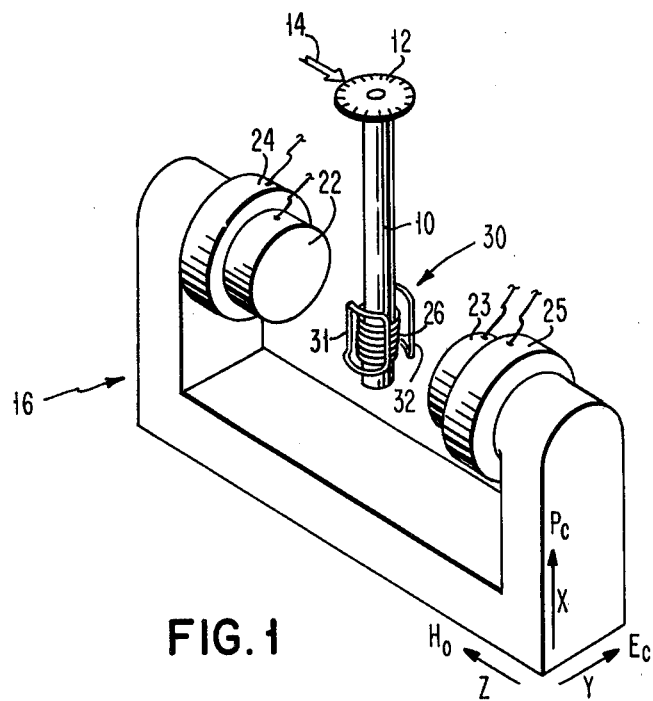
FIG. 1 is an illustration of a conventional NMR spectrometer, showing the general relationship of the spinning apparatus, according to the invention, in the desired operational environment.

Referring to FIG. 1, a part of the spinning arrangement is shown here only generally as a cylindrical member 10 at the upper end of which there is affixed a dial plate 12 for cooperating with an index pointer 14°, these components which will be more completely described hereinafter. In an older form of spectrometer, a magnet assembly 16 of generally C-shaped configuration has two pole faces 22 and 23 between which the probe cylinder 10 is arranged as shown. A strong static or dc magnetic field $H_o$ is established by means of a pair of windings 24 and 25 in conventional manner. The turns of a solenoid winding or coil 26 surround the cylindrical member 10 while another solenoid winding 30 is wound in two sections 31 and 32 about the first winding. A faraday shield (not shown) is conventionally provided between the windings 31, 32 of the solenoid 30 and the coil 26 to reduce the electrostatic coupling therebetween to a minimum. The axis of the coils 26 and 30 are at 90° whereby the magnetic coupling therebetween approaches zero, however, it is conventional to introduce some leakage coupling therebetween in many nuclear magnetic resonance (NMR) spectrometers for establishing the operational mode desired. The longitudinal axis of the cylinder 10, hereinafter termed the X or $P_c$ (pickup coil) axis, is at 90° to the axis of the solenoid winding coil 30, hereinafter termed the Y or $E_c$ (exciting coil), axis and also 90° to the magnetic field axis, hereinafter, termed the Z or $H_o$ (magnetic field) axis. This illustration of the structure is intended to show clearly the component parts and their relationship to each other rather than to show an actual construction to scale. For example, in actual practice the pole faces 22 and 23 are arranged quite close to the central components comprising the coil 30, the coil 26 and the cylinder 10.

The dial plate 12 is preferably divided into divisions totaling 360° and is aligned with a component within the cylinder 10 which is to be described hereinafter whereby that component can be aligned readily at a predetermined angle, read by the pointer 14, and particularly the angle of 54.7°; this angle stems from a solution of the second Legendre polynomial expression 3 $Cos^2$ $\theta - 1 = 0$. This setting is used for optimizing the operation of an NMR spectrometer as will be described hereinafter.

Figure 2:
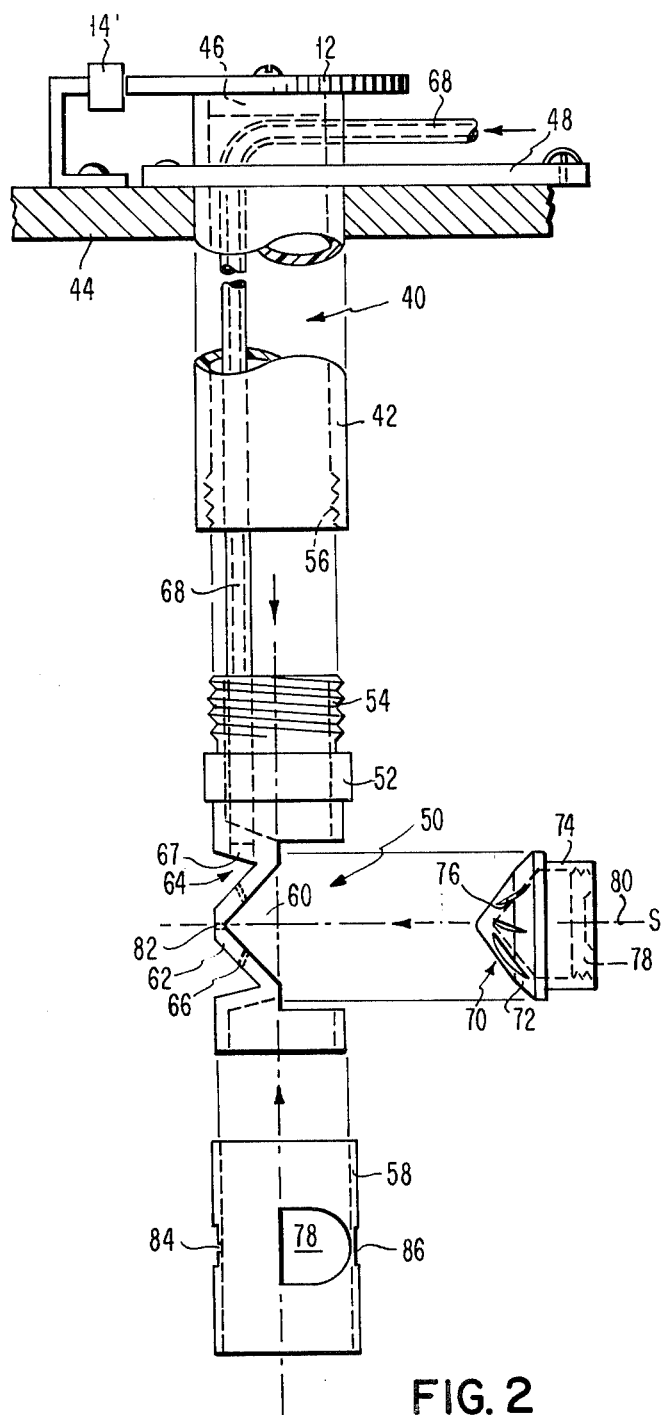
FIG. 2 is an exploded diagram of the NMR spinning apparatus according to the invention.

The apparatus encompassed by the cylinder 10 as hereinabove described is shown in FIG. 2 as an embodiment of a structure according to the invention. A supporting section 40 is shown in the form of a relatively long tube 42 which can readily be slipped into a supporting member 44 shown here in only the barest detail as this supporting structure forms no part of the invention in and of itself. A plug 46 in the upper end of the tube 42 holds the dial plate 12 while the tube 42 is held at the desired elevation by any suitable means, a spring held friction member 48 being shown as one example. In the vertical attitude of the tube cylinder 42 the clamping member 48 preferably is a spring loaded scissor-like assembly having opposing V-notches for gripping the tube 42 and holding it in place vertically and centrally between the pole faces of the magnet. Obviously those skilled in the art will adapt other arrangements for supporting the probe as this support forms no part of the invention in and of itself. The pointer 14 preferably is given a thickness in the vertical direction of the order of the variation in depth to which the tube 42 is positioned.

A structural member 50 comprises a nonmagnetic cylinder 52 of diameter substantially equal to the outside diameter of the tube 42. The upper end of the cylinder 52 is undercut and machined to provide threads 54 which mate with threads 56 within the tube 42. The upper end of the cylinder 52 is bored as shown to match the internal wall of the tube 42 while leaving the remainder of the cylinder 52 substantially solid for permitting subsequent machining operations that result in the structure to be described. At the lower end, the cylinder 52 is undercut to receive a tubular sleeve 58 of maximum diameter substantially equal to the outside diameter of the tube 42 and of the cylinder 52 as hereinbefore described. The sleeve 58 also has apertures machined therein which will be described hereinafter at a more appropriate time.

Half of the lower end of the cylinder is machined away leaving a plane surface along the longitudinal axis of the cylinder 52. A right conical bore or recess 60 is then machined out, after which the portion of the cylinder 52 opposite the depression 60 is machined to leave conical wall 62 and thereabout an annular bore or cavity 64. Several bores permit communication between the recesses 60 and 64. Only one bore 66 of three or four such bores is shown. The cylinder 52 has a tubular bore 67 as shown into which a flexible tube 68 is fitted for admitting gas into the annular recess 64 which forms a manifold for the gas jets or bores 66. When the sleeve member 58 is in place, gas exiting from the tube 68 is forced through the bores 66 into the recess 60. The purpose of this gas is to form a low friction bearing for and to drive a rotating sample spinner 70. The latter comprises a conical section 72 mating with the conical recess 60 and has a cylindrical body portion 74 as shown. Preferably the conical section 72 has a series of flutes 76 spaced therearound serving as impeller cups for enhancing the drive effect. The sample spinner is of maximum dimensions no greater than the space remaining within the sleeve member 58. Apertures 78 on either side of the sleeve member 58 permit escape of the driving gas. The sample spinner 70 rides on a gas bearing formed between the conical inner surface of the ball member 62 and the conical surface 72 of the spinner 70. The conical head portion preferably is given a compound angle as shown for importing greater ease in standing up and greater stability in spinning. The larger section of the conical head is given an angle, say 44.0°, close to angle, say 45°, of the conical bore 60 and the smaller portion is given a greater angle by 1-5 degrees, say 50.5°, from the longitudinal axis of the rotor assembly. Optionally, a bore 82 located at the apex of the recess 60 is dimensioned to enhance the efficacy of the air bearing described above. When the bore 82 is present, an apperture 84 in the sleeve member 58 is preferably included. Another aperture 86 in the sleeve member 58 opposite the aperture 84 forms another optional constructional feature for similar effect.

When the sample material permits of handling in solid form, the sample spinner 70 is made entirely of the sample material and the spinner 70 is the sample that is spun. When the sample material cannot be thus formed into the spinner, the spinner 70 is made of suitable nonmagnetic material, hollowed out and fitted with a cap 78 in the cylindrical portion 74. The sample material is then inserted in the hollow spinner 70 for spinning. The samples of material to be encapsuled in a hollow spinner 70 may be in solid, liquid or gaseous form. In solid form material may be substantially in one piece, in relatively large granuals, or in powder form. The materials may be spun over a range of temperatures by heating and/or cooling the gas fed through the tube 68 to support and to drive the spinner 70.

As thus far described the spinner 70 is spun with the longitudinal axis 80 lying horizontally. Alternately, however, the supporting tube 42 could be arranged horizontally with the axis 80 extending in the vertical direction and the spinner 70 uppermost. There are decided advantages in using the latter attitude. One is that the spinner positions itself in an attitude for easy formation of the gas bearing. However, even with the spinner itself in the horizontal attitude, it is confined within the sleeve member 58 to an initial attitude in the recess 60 whereby it will assume the proper attitude for spinning as soon as the gas flow forms a gas bearing.

Figures 3, 4:
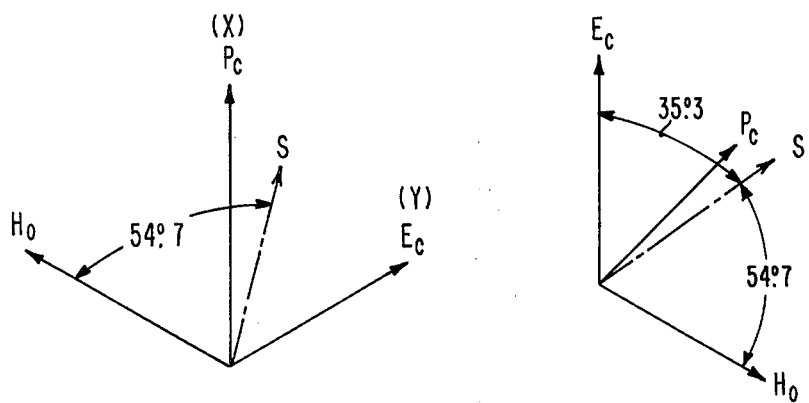
FIGS. 3 and 4 are diagrams showing the relationship between the various axes of the spectrometer and the spinning apparatus, according to the invention.

FIG. 3 is a vector diagram illustrating the third dimensional relationships between the spin axis S, the magnetic field axis $H_o$, the $E_c$ axis and the $P_c$ axis when the spinning apparatus is arranged in the vertical attitude, while FIG. 4 is a similar diagram for the relationships when the spinning apparatus is in the horizontal attitude. In both of these diagrams, the spin axis S is arranged at 54.7° from the magnetic axis in the plane defined by the magnetic axis and the exciting axis. The particular secondary designations of X, Y, and Z axes are conventional in NMR spectroscopy.

Figure 5:
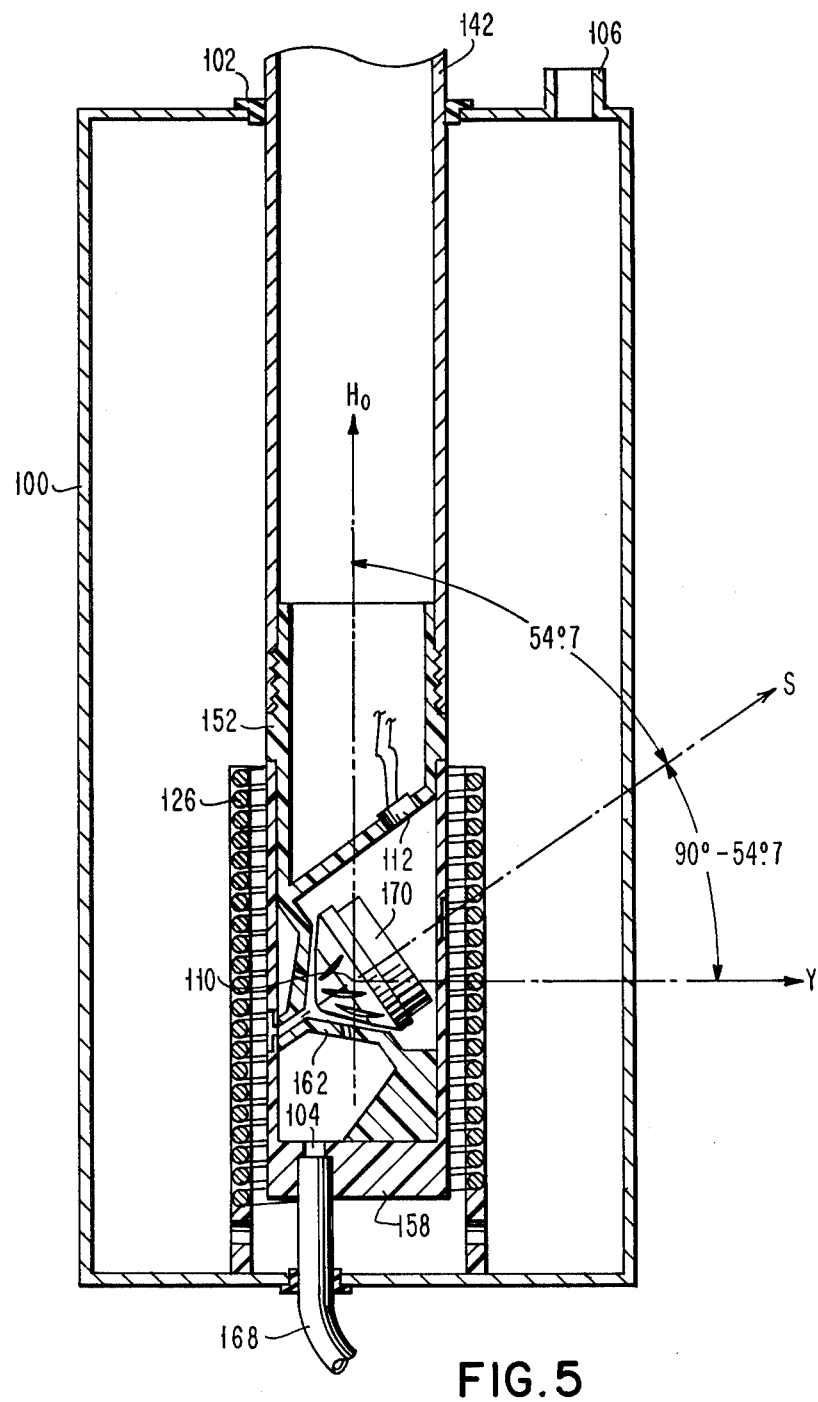
FIG. 5 is a cross-section view of an assembled alternate embodiment of NMR spinning apparatus according to the invention.

Another embodiment of the invention is shown in FIG. 5. A container 100 made of aluminum, or some other nonmagnetic material, is arranged in a magnetic field wherein the lines of flux extend in the direction of the longitudinal axis of the container 100, and the spinning apparatus is inserted in the container with the longitudinal axes coinciding. The spinning apparatus is held in place by a resilient seal 102, in which the tubing 142 is gripped sufficiently tight to hold it in place during operation. Wherever possible, in this description, reference numerals for the different components will be the same as for those in the earlier description, but raised by 100. The main body 152 of the spinning apparatus slips inside a sensing coil 126 and is essentially the same as that previously described, except that the angle of the spinning axis S is at a desired predetermined angle, shown as 54.7° from the vertical. This angle is most frequently used, however, should adjustability of the angle of attack of the spinner 170 be desired, it is contemplated that the body member 152 be constructed with a position in the form of a cylindrical member or of a spherical member with center at the intersection 110 of the $H_0$ and the Y axes, whereby the angle of attack may be adjusted prior to the insertion of the spinning apparatus into the container 100. The structure of the spinning apparatus is otherwise much the same as before. Gas is directed through the tubing 168 into the manifold and thence through the jets for forming a gas bearing and for driving the rotor assembly 170. Escaping gas passes through a passage 104 in the cover member 158 into the remainder of the container 100 for maintaining the sample in an atmosphere of the gas. The container 100 is vented by suitable arrangement, such as the vent 106 shown here. A temperature sensing device 112 is arranged to monitor the temperature in the vicinity of the rotor assembly 170. Alternatively, a simple thermometer may be mounted with the sensitive tip at a desired point within the container 100.

The spinning apparatus according to the invention is made of any machineable nonmagnetic material, and preferably nonmetallic as well, in the interests of avoiding eddy currents and the like. A form of boron nitride has been used, and spinning apparatus has been made by machining polychlorotrifluoroethylene stock. Other suitable materials will be suggested to those skilled in the art.

While the invention has been described in terms of express embodiments, and alternatives have been suggested, it is clearly to be understood that those skilled in the art will effect further changes without departing from the spirit and scope of the invention as defined in the appended claims.

The invention claimed is:

1. Spinning apparatus for nuclear magnetic resonance spectrometers, including a stator assembly comprising a body member having a central longitudinal axis, said body member having a conical bore arranged therein with the apex of said bore at one side of the body member with the longitudinal axis of said bore arranged at an angle to said longitudinal axis of said body member lying between 45° and 90° and with the base of the conical bore lying between said longitudinal axis of said body member and said one side thereof, said body member having a multiple of apertures therethrough into said conical bore forming jets and a bore communicating with said jets and extending parallel to said longitudinal axis of said body member to one end thereof for carrying gas to said conical bore for establishing a gas bearing and for driving a rotor assembly, and a cover member adapted to fit over said body member about said conical bore for substantially confining a rotor assembly in said conical bore and for directing driving gas in said body member, said cover member having at least one aperture on the side of said body member opposite said one side for venting gas spent in driving said rotor assembly, and a rotor assembly comprising a conical head portion and a cylindrical tail portion of diameter smaller than that of the base of said conical head portion with the dimensions of said conical head portion in part substantially complementing those of said conical bore and in part substantially departing from those of said conical bore in said stator assembly, and the overall dimensions of said rotor assembly are less than the internal dimensions delimited by said cover member.

2. Spinning apparatus for nuclear magnetic resonance spectrometers, including a stator assembly comprising a body member having a central longitudinal axis, said body member having a conical bore arranged therein with the apex of said bore at one side of the body member with the longitudinal axis of said bore arranged at an angle to said longitudinal axis of said body member lying between 45° and 90° and with the base of the conical bore lying between said longitudinal axis of said body member and said one side thereof, said body member having a multiple of apertures therethrough into said conical bore forming jets and a bore communicating with said jets and extending parallel to said longitudinal axis of said body member to one end thereof for carrying gas to said conical bore for establishing a gas bearing and for driving a rotor assembly, and a cover member adapted to fit over said body member about said conical bore for substantially confining a rotor assembly in said conical bore and for directing driving gas in said body member, said cover member having at least one aperture on the side of said body member opposite said one side for venting gas spent in driving said rotor assembly, and a rotor assembly comprising a conical head portion and a cylindrical tail portion of diameter smaller than that of the base of said conical head portion with the dimensions of said conical head portion complementing those of said conical bore in said stator assembly and the overall dimensions less than the internal dimensions delimited by said cover member, and said conical head portion is cut in two slopes with the outer section approaching said conical bore and the section at the apex making a larger angle with the longitudinal axis of the rotor assembly.

3. Spinning apparatus for nuclear magnetic resonance, spectrometers as defined in claim 2 and wherein
said rotor assembly is hollow and fitted with a cap at the end of said cylindrical portion whereby a sample can be confined in said rotor assembly for spinning.

4. Spinning apparatus for nuclear magnetic resonance spectrometers as defined in claim 2 and wherein
said rotor assembly is equipped with fluting on the conical head portion for enhancing the effect of driving gas.

5. Spinning apparatus for nuclear magnetic resonance spectrometers as defined in claim 1 and wherein
said angle is 90°.

6. Spinning apparatus for nuclear magnetic resonance spectrometers as defined in claim 1 and wherein
said angle is 54.7°.

7. Spinning apparatus for nuclear magnetic resonance spectrometers as defined in claim 1 and wherein
said cylindrical body and tubular sleeve members are arranged in an electric solenoid of dimensions encompassing said rotor assembly in said conical bore, and
said solenoid is arranged in an electric coil with the longitudinal axis of the solenoid and the coil normal to each other, and
said solenoid and said coil are arranged between the pole faces of a magnet assembly with the lines of the flux therefrom normal to said axis of both said coil and said solenoid.

8. Spinning apparatus for nuclear magnetic resonance spectrometers as defined in claim 7 and wherein
the longitudinal axis of said rotor assembly and said conical bore are arranged at an angle of substantially 54.7° from the axis defined by said lines of flux in a plane defined by said lines of flux and said longitudinal axis of said electric coil.

9. Spinning apparatus for nuclear magnetic resonance spectrometers, including
a stator assembly adapted for cooperation with a rotor assembly,
said stator assembly comprising
a cylindrical body member having a central longitudinal axis,
said body member having a conical bore arranged therein with the apex of said bore at one side of the body member with the longitudinal axis of said bore at an angle to said longitudinal axis of said body member lying between 45° and 90° and the base of the conical bore lying between said longitudinal axis of said body member and said one side thereof,
said body member having a multiple of apertures therethrough into said conical bore forming jets and an elongated bore leading from said jets and extending parallel to said longitudinal axis of said body member to one end thereof, and
a tubular sleeve member adapted to fit over said body member about said conical bore for confining a rotor assembly in said conical bore and for directing driving gas within said body member,
said sleeve member having at least one aperture on the side of said body member opposite said one side,
said sleeve member having at least one aperture on the side of said body member opposite said one side for venting gas spent in driving said rotor assembly, and
said rotor assembly comprising
a conical head portion and a cylindrical tail portion of diameter smaller than that of the base of said conical head portion with the configuration of said conical head portion being in the form of two adjoining conical surfaces of which one is complementing that of said conical bore in said stator assembly the other departs substantially therefrom and
the overall dimensions of that surface of said rotor assembly are less than the internal dimensions delimited by said cover member.

10. Spinning apparatus for nuclear magnetic resonance spectrometers as defined in claim 9 and wherein
said body member has an annular bore having a longitudinal axis concentric with that of said conical bore forming a manifold between said elongated bore and said jets at said one side of said body member.

11. Spinning apparatus for nuclear magnetic resonance spectrometers as defined in claim 9 and incorporating
a supporting cylindrical member arranged to be attached to said one end thereof and having a longitudinal bore communicating with said elongated bore for conveying gas to said manifold.

12. Spinning apparatus for nuclear magnetic resonance spectrometers as defined in claim 10 and wherein
said body member and said sleeve member are each fitted with a bore leading through the apex of said conical bore concentric with said annular bore to the outside of said sleeve member at said one side thereof.

13. Spinning apparatus for nuclear magnetic resonance spectrometers as defined in claim 1 and incorporating
an electric solenoid of dimensions encompassing said body member and establishing a field of magnetic flux with the lines of flux parallel to the longitudinal axis of said body member.

14. Spinning apparatus for nuclear magnetic resonance spectrometers as defined in claim 13 and wherein
said angle is 54.7°.

15. Spinning apparatus for nuclear magnetic resonance spectrometers as defined in claim 1 and wherein
said body member is substantially cylindrical about said longitudinal axis, and
said cover member is substantially tubular with an outside diameter substantially the same as that of said cylindrical body member.

16. Spinning apparatus for nuclear magnetic resonance spectrometers as defined in claim 13 including
a rotor assembly adapted for cooperation with a stator assembly having a conical bore therein for accommodating said rotor assembly,
said rotor assembly comprising
a cylindrical tail portion of given diameter, and
a conical head portion having a base larger than said given diameter, p1 said head portion having two adjoining conical surfaces insertable in said conical bore of said stator assembly,
one of said conical surfaces being frustro conical and having a peripheral surface essentially parallel to the inner surface of said conical bore, and
the other conical surface having an angle greater than the angle of said conical bore.

17. Spinning apparatus for nuclear magnetic resonance spectrometers as defined in claim 16 and wherein said rotor assembly is hollow and fitted with a cap at the end of said cylindrical portion whereby a sample can be confined in said rotor assembly for spinning.

18. Spinning apparatus for nuclear magnetic resonance spectrometers as defined in claim 16 and wherein said rotor assembly is equipped with fluting on the conical head portion for enhancing the effect of driving gas.

* * * * *